United States Patent [19]
Seitz

[11] Patent Number: 5,276,396
[45] Date of Patent: Jan. 4, 1994

[54] PLANAR MAGNETIC HARMONIC SENSOR FOR DETECTING SMALL QUANTITIES OF MAGNETIC SUBSTANCES

[75] Inventor: Thomas Seitz, Zug, Switzerland

[73] Assignee: Landis & Gyr Betriebs AG, Zug, Switzerland

[21] Appl. No.: 851,651

[22] Filed: Mar. 16, 1992

[30] Foreign Application Priority Data

Mar. 26, 1991 [CH] Switzerland ............ 00928/91

[51] Int. Cl.⁵ ............ G01N 27/72; G01R 33/12; G01R 33/04
[52] U.S. Cl. ............ 324/239; 324/253
[58] Field of Search ............ 324/253, 254, 255, 249, 324/326, 327, 328, 329, 239, 240; 33/361; 336/232

[56] References Cited

U.S. PATENT DOCUMENTS

| | | |
|---|---|---|
| 3,643,155 | 2/1972 | Riddle et al. |
| 3,833,872 | 9/1974 | Marcus et al. ............ 336/232 |
| 3,848,210 | 11/1974 | Felkner. |
| 4,864,238 | 9/1989 | Seitz. |
| 4,967,156 | 10/1990 | Seitz. |
| 5,014,006 | 5/1991 | Seitz. |

FOREIGN PATENT DOCUMENTS 0284196 2/1988 European Pat. Off..
3738455 6/1988 Fed. Rep. of Germany.

*Primary Examiner*—Walter E. Snow
*Attorney, Agent, or Firm*—Davis Hoxie Faithfull & Hapgood

[57] ABSTRACT

A device is disclosed for detecting the presence and/or determining the configuration of a magnetic substance. The device includes a magnetic circuit having a magnetic core and an air gap. Coupled to the magnetic circuit are an excitation coil, for periodically driving the magnetic circuit into saturation, and a measurement coil, for measuring the effective appearing permeability of the magnetic circuit in the presence of the magnetic substance.

18 Claims, 3 Drawing Sheets

PLANAR MAGNETIC HARMONIC SENSOR FOR DETECTING SMALL QUANTITIES OF MAGNETIC SUBSTANCES

RELATED CASE

This application contains subject matter which is related to the subject matter of an application entitled Planar, Core Saturation Principle, Low-Flux Magnetic Field Sensor filed for Thomas Seitz on even date herewith and assigned to the assignee hereof. The contents of the related U.S. application, which bears Ser. No. 07/851,443, are incorporated herein by reference.

FIELD OF THE INVENTION

The present invention relates to a device for detecting the presence and determining the form of small quantities of a magnetic substance.

BACKGROUND OF THE INVENTION

It is often desirable to detect magnetic substances which are present in small quantities such as magnetic ink or a paramagnetic gas such as oxygen. For instance, an automatic banknote recognition device may read and or detect an image written or printed with magnetic ink on banknotes of countries including the United States, Japan or Germany. Alternatively, a gas analyzer may detect the presence of a paramagnetic gas. Additionally, it is often desirable to measure the rotational speed of a toothed wheel made of a magnetic material or at least the speed of the teeth and teeth intervals which are coated with a magnetic material.

U.S. Pat. No. 4,864,238 discloses a device for measuring low-flux magnetic fields of the type produced by the magnetized magnetic ink found on banknotes. This patent discloses an extremely sensitive sensor, functioning on the core saturation principle, for measuring the extremely weak magnetic fields produced by the magnetized ink of the banknote. Such magnetic fields typically have a value in the order of $10^{-3}$ Gauss. In comparison, the Earth's magnetic field intensity is 0.5 Gauss or approximately three orders of magnitude greater than the fields of magnetized banknote ink. As such, the above-mentioned sensor requires extensive and costly magnetic shielding to accomplish its task. Furthermore, the banknote must be magnetized by a strong permanent magnet before being read.

It is the object of the present invention to provide a magnetic sensor for which no permanent magnet and no costly and extensive magnetic shielding against foreign magnetic fields is required. It is a further object to provide a sensor capable of static measurement, at least in detecting the presence of the magnetic substance, where the static measurement covers most of the overall image of the magnetic substance (e.g., most of a printed image on a banknote without relative movement between the magnetic substance and sensor). Such a feature would afford greater security against misuse.

SUMMARY OF THE INVENTION

These and other objectives are achieved by means of the present invention which is directed to a device for detecting the presence and/or determining the configuration of a magnetic substance. The device includes a sensor including a magnetic circuit which has a core and an air gap. The sensor operates on the core saturation principle. An excitation coil is magnetically coupled to the magnetic circuit which periodically drives the magnetic circuit into saturation. Additionally, a measuring coil is magnetically coupled to the magnetic circuit which measures the effective appearing permeability of the magnetic circuit. Thus, when a magnetic substances is located in the air gap of the magnetic circuit, the measuring coil measures a different appearing permeability thereby detecting the presence, and/or determining the configuration of the magnetic substance.

Illustratively, the excitation coil, the measurement coil and ferromagnetic core are insulated from one another. In such an embodiment, each of those elements may be fashioned in a single, separate layer, the three separate layers being parallel to one another.

The inventive device may illustratively be provided with an evaluation means for evaluating a harmonic of a voltage measured by the measuring coil. In such a case, the excitation magnetic field $H[t]$, which induces the measured voltage, illustratively has an amplitude $H_{max}$ which is greater than the saturation magnetic filed $H_s$ of the magnetic circuit such that $2k \cdot H_{max} = n \cdot H_s$ where n is an integer representing the mode number of the evaluated harmonic.

BRIEF DESCRIPTION OF THE DRAWINGS

Examples of embodiments of the invention are shown in the drawing and are described in greater detail below.

Identical reference numbers indicate the same parts in all of the figures.

DETAILED DESCRIPTION OF THE INVENTION

Figure 1:
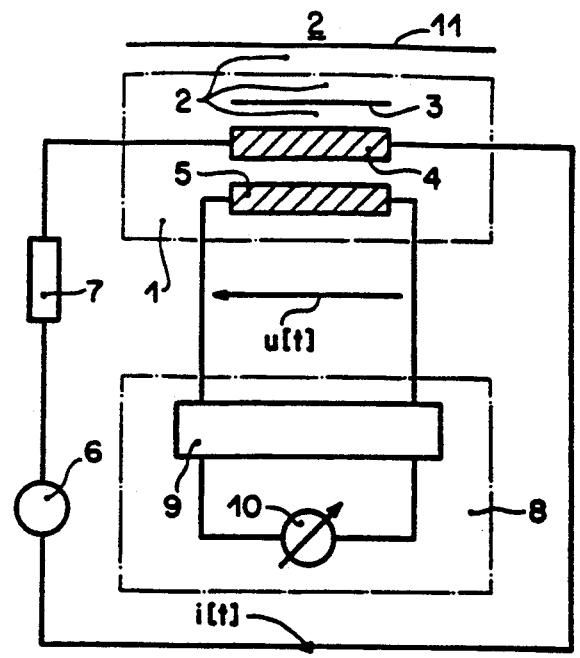
FIG. 1 shows a schematic electrical diagram of a detector according, to the invention.

Referring now to FIG. 1, a magnetic field detector is depicted having a sensor 1 including a magnetic core 3 and air gap 2 which form the magnetic circuit 2;3. The sensor 1 also has two coils 4 and 5. The two coils 4 and 5 are inductively coupled together and are installed on the same side of core 3 (the lower side, as shown in FIG. 1).

A generator 6 supplies the first coil 4, of the two coils 4 and 5, with at least one excitation current $i[t]$ of period T via a resistor 7. The excitation current, which is variable with respect to time, is preferably a sawtooth-shaped function of time t but can also be another periodic function such as a sinusoid function. A sawtooth-shaped excitation current $i[t]$ induces a sawtooth-shaped excitation of the core 3 which produces fewer losses than a sinusoid excitation current $i[t]$ with equivalent control. The coil 5 is a measuring coil having two terminals at which an output voltage $u[t]$ of the sensor 1 appears.

The detector shown in FIG. 1 is additionally provided with a device 8 for evaluating a harmonic of the output voltage $u[t]$ of sensor 1. The output of the sensor 1 is connected to the input of the evaluation device 8 which illustratively comprises a band pass amplifier 9 and a voltmeter 10. If such a structure is used, the band pass amplifier 9 filters a desired harmonic from the frequency spectrum of the output voltage u[t] and amplifies it for evaluation. The voltmeter 10 is an a.c. voltmeter and illustratively measures the effective value of the output voltage of the band pass amplifier 9, i.e., of the filtered amplified harmonic.

FIG. 1 illustratively depicts a device for use with a banknote 11 on which a magnetic ink is printed. The banknote 11 and the magnetic substance printed thereon are at least periodically located in the proximity of the core 3, inside the gap 2, specifically on the side of the core 3 away from the two coils 4 and 5, for purposes of evaluation. If the core 3 is a flat core, as is assumed in FIG. 1, the banknote 11 is positioned in parallel with the core 3, at a distance of up to approximately 1 mm from the core 3.

The sensor 1 operates on the core saturation principle. Since the latter is known and is also described in the above-mentioned prior art reference, it is described only briefly below for a better understanding of the invention.

Figure 2:
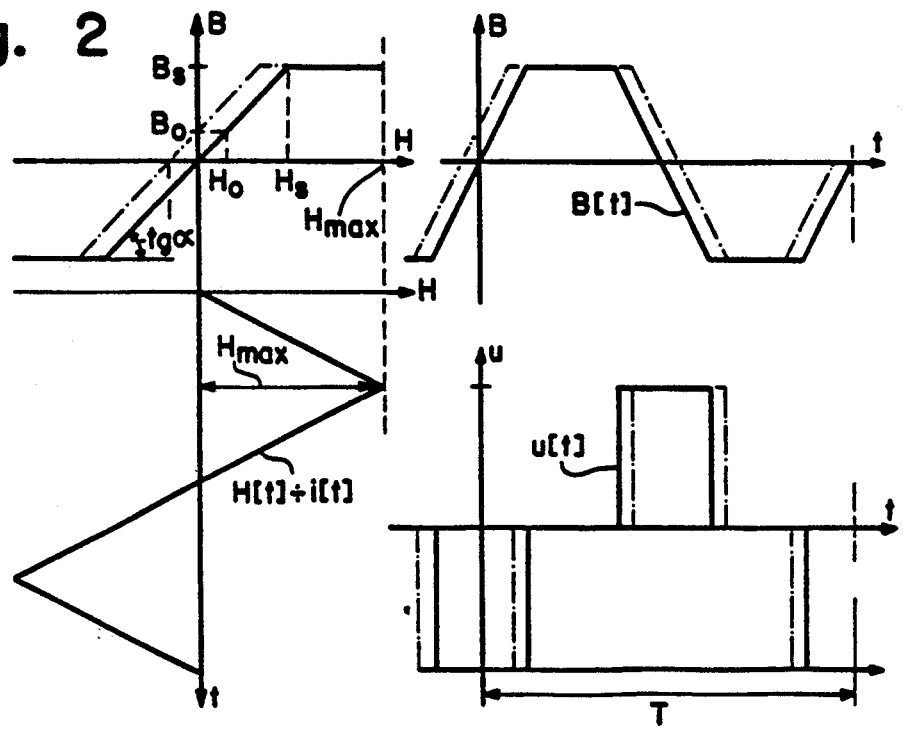
FIG. 2 shows a graphic representation of the core saturation principle.

A graph is depicted in the upper left portion of FIG. 2 which plots an ideal characteristic line B[H] of a effective induction B of the magnetic circuit 2;3 as a function of the magnetic excitation field H[t] produced by the excitation current i[t]. In this graph, the hysteresis of the ferromagnetic core 3 is neglected and the characteristic line is assumed to be linear outside of the saturation. In FIG. 2, B designates the saturation induction corresponding to a magnetic saturation field $H_s$. At the lower left of FIG. 2, the magnetic excitation field H[t], which is induced by the excitation current i[t] flowing through the excitation coil 4, is plotted as a function of time t. In FIG. 2, it is assumed that the excitation current i[t] induces a sawtooth magnetic excitation field H[t] which is a periodic function of time t. The amplitude $H_{max}$ of the sawtooth-shaped magnetic excitation field H[t] is selected to be sufficiently large to periodically drive the ferromagnetic core 3 into saturation. As a result, the magnetic induction B[t] present in the magnetic circuit 2;3 has a trapezoidal shape with respect to time t (see the upper right portion of FIG. 2). The slanted edges of the trapezoidal waveforms produce the periodic voltage u[t] of period T in the measuring coil 5, the periodic voltage u[t] waveform comprising a series of alternating positive and negative rectangular voltage impulses.

The characteristic lines shown in FIG. 2 by dots and dashes are produced by an external magnetic field $H_o$, e.g., the magnetic field of the magnetized magnetic ink of a banknote 11 having a corresponding magnetic induction $B_o$. In particular, the rectangular voltage impulses of the output voltage u[t] are asymmetrical with respect to the time axis. This asymmetry can be utilized to measure the strength of the external magnetic field $H_o$. In each instance, the periodic output voltage u[t]-comprises (in accordance with a Fourier analysis) a fundamental harmonic assigned the mode number one, and a plurality of continuously numbered harmonics modes, assigned mode numbers beginning with two. The mode numbers of the fundamental harmonic and the other harmonics are hereinafter designated by n.

As described in U.S. Pat. No. 4,864,238, the strength of the external magnetic field H of the magnetized magnetic ink may be determined by evaluating the second harmonic wave of the output voltage u[t]. According to a Fourier analysis, the amplitude of the $n^{th}$ harmonic wave is equal to:

$$U_n = [(16 H_{max}/(n \cdot \pi H_s))] \mu_o \cdot \mu_r^* \cdot n_2 \cdot f_1 \cdot F \cdot H_s$$
$$\sin[(n \cdot \pi \cdot H_s)/(2 H_{max})] \cdot \sin[(n \cdot \pi / 2)] 1 + H_o / H_{max})] \quad (1)$$

where $\mu_o$ is the permeability of a vacuum, $\mu_r^*$ is the effective appearing permeability of the magnetic circuit 2;3 (and also the slope tgα of the sensor curve B(H) outside the saturation range as depicted in FIG. 2), $n_2$ is the number of windings of the measuring coil 5, $f_1$ is the frequency of the fundamental mode of the excitation current i[t] (and therefore also the frequency of the fundamental mode of the output voltage u[t]), F is the surface area of the cross-section of the core 3 and $H_{max}$ is the amplitude of the magnetic excitation field H[t]. In an H-shaped ferromagnetic core 3 (see FIG. 4) which has two relatively wide main strips connected by one narrow oblong transversal strip, F is the surface area of a cross-section of the transversal strip taken perpendicular to the longitudinal axis of the transversal strip (see FIGS. 3-4). The effective appearing permeability $\mu_r^*$ of the magnetic circuit 2;3 is known to be equal to $1/[N + (1/\mu_r)]$ where N is the so-called demagnetizing factor and $\mu_r$ is the relative permeability of the ferromagnetic material of core 3.

If the sensor 1 is subjected to a periodic magnetic excitation field H[t] whose amplitude $H_{max}$ is greater than the magnetic saturation field H of the magnetic circuit 2;3 and if the amplitude $H_{max}$ is an even-numbered multiple $2k \cdot H_{max}$ of the magnetic saturation field $H_s$ of the magnetic circuit 2;3, the core 3 is intermittently driven into saturation and the first sinus factor in the equation (1) (and thereby also the amplitude $U_n$ of the harmonic wave) is equal to zero despite the presence of any external magnetic field $H_o$. This is if the factor k is any desired integral number.

If a magnetic substance, such as magnetic ink, now appears in proximity of the sensor 1, e.g., in the air gap 2, the sensor 1 is detuned. This is because the demagnetizing factor N, and, therefore, also the slope of the sheared characteristic line B[H], are modified by the presence of the magnetic substance. This leads to a different value of the magnetic saturation field $H_s$. Thus, the condition $2k \cdot H_{max} = n \cdot H_s$ for the zero amplitude value of the corresponding harmonic of interest is no longer met for a given value $H_{max}$ of the amplitude of the magnetic excitation field H[t]. For this reason, the full spectrum of harmonics once again appears. In the case of a small detuning, such as the detuning which occurs in the presence of magnetic ink, the value of the amplitude $U_n$ of the harmonic wave increases in an almost linear manner.

In a first embodiment according to the invention, the evaluated harmonic is an even-numbered harmonic of the output voltage u[t] of sensor I. In order to obtain maximum sensitivity of the device in that case, a constant magnetic field $H_o$, e.g., the magnetic field of a permanent magnet, should be present in addition to the magnetic excitation field H[t]. Such additions maximize the value of amplitude $U_n$ of the corresponding even-numbered harmonic. Instead of a permanent magnet, a d.c. current $I_o$, which produces a constant magnetic field $H_o$, flows through the first coil 4 during the operation of the invention in addition to the periodic time-variable excitation current i[t]. The amplitude $U_n$ of the even numbered harmonics reaches its maximum when the second sinus factor in the equation (1) has a value close to one. Hence, n times the constant magnetic field $H_o$ should preferably be equal to an odd multiple of the amplitude $H_{max}$ of the magnetic excitation field $H[t]$, i.e., equal to $(2k+1)\cdot H_{max}$, to maximize the value of the amplitude $U_n$ of the even-numbered harmonic.

Because a sinus function is known to be relatively flat near its maximum, the sensor 1 is relatively insensitive to changes of external magnetic fields including interfering magnetic fields (e.g., the Earth's magnetic field). Thus, the sensor 1 may function without magnetic shielding. This is possible because the sensor 1 does not measure a magnetic field but merely indirectly determines, by way of the amplitude $U_n$ of a harmonic the effective appearing permeability $\mu_r^*$ of the magnetic circuit 2;3.

To avoid high frequency problems and/or high frequency losses, such as strong attenuation, strong eddy current losses etc., preferably a relatively low-frequency harmonic is selected for evaluation. If an even-numbered harmonic is used, it is preferably the fourth harmonic of the output voltage $u[t]$ of sensor 1. The amplitude of the fourth harmonics is equal to:

$$U_4 = (4/\pi) \cdot \mu_o \cdot \mu_r^* \cdot n_2 \cdot f_1 \cdot F \cdot H_{max} \sin(2\pi H_s/H_{max}) \cdot \sin(2\pi H_o/H_{max}) \quad (2)$$

For the evaluation of the fourth harmonic, the amplitude $H_{max}$ of the magnetic excitation field $H[t]$ is preferably twice as large as the magnetic saturation field $H_s$ of the magnetic circuit 2;3. In other words, by selecting $H_{max} = 2 \cdot H_s$, the first sinus factor in the equation (2) is set equal to zero. In this case, the constant magnetic field $H_o$ should preferably have a value of $H_{max}/4$, i.e., equal to one fourth of the amplitude $H_{max}$ of the periodic, time-variable magnetic excitation field $H[t]$.

In a second embodiment according to the invention, the evaluated harmonic is an odd-numbered harmonic of the output voltage $u[t]$ of sensor I. For the same reasons mentioned in regard to the evaluation of even-numbered harmonics modes, the harmonic serving for the evaluation is, again, preferably a relatively low-frequency harmonic. Preferably, in such a case, the third harmonic of the output voltage $u[t]$ of sensor 1 is used.

The amplitude of the third harmonic is equal to:

$$U_3 = (16/3\pi) \cdot \mu_o \cdot \mu_r^* \cdot n_2 \cdot f_1 \cdot F \cdot H_{max} \sin(3\pi H_s/2H_{max}) \cdot \cos(3\pi H_o/2H_{max}) \quad (3)$$

For the evaluation of the third harmonic, the amplitude $H_{max}$ of the magnetic excitation field $H[t]$ is preferably 1.5 times the magnetic saturation field $H_s$ of the magnetic circuit 2;3. In other words, by selecting $H_{max} = 1.5 \cdot H_x$, the first sinus factor in the equation (3) is set equal to zero. Using the third harmonic therefore, is more advantageous than using the fourth harmonic because a smaller amplitude $H_{max}$ of the time dependent magnetic excitation field $H[t]$ is required to cancel out the harmonics which appear in the absence of a magnetic substance. In order to obtain maximum sensitivity (i.e., to maximize the amplitude $U_n$ of the evaluated odd-numbered harmonic of the magnetic field sensor with an odd-numbered harmonic mode, no constant magnetic field $H_o$ should be utilized in conjunction with the magnetic excitation field $H[t]$. This is because the second sinus factor of the equation (1) is always a cosinus factor (see equation (3)). This cosinus factor is always equal to one if $H_o = 0$. The second embodiment therefore has the advantage that the value of the amplitude $U_n$ of the odd-numbered harmonic wave is maximized when no constant magnetic field $H_o$ is present.

The cosinus function is just as insensitive to external magnetic fields when it is near its maximum as the sinus function. Thus, no shielding is needed in the second embodiment. In both embodiments, the sensor 1 does not measure a magnetic field but instead measures the effective appearing permeability $\mu_r^*$ of the magnetic circuit 2;3 having a magnetic substance located within its air gap 2. For example, the peak value $U_4$ of the fourth harmonic wave may have a value in the order of magnitude of $10\mu V$ when a dollar note is 1 mm from the sensor 1. The frequency of the periodic time-variable excitation current $i[t]$ is preferably 20 to 200 kHz and the measuring coil 5 may illustratively have 100 windings.

Figure 3:
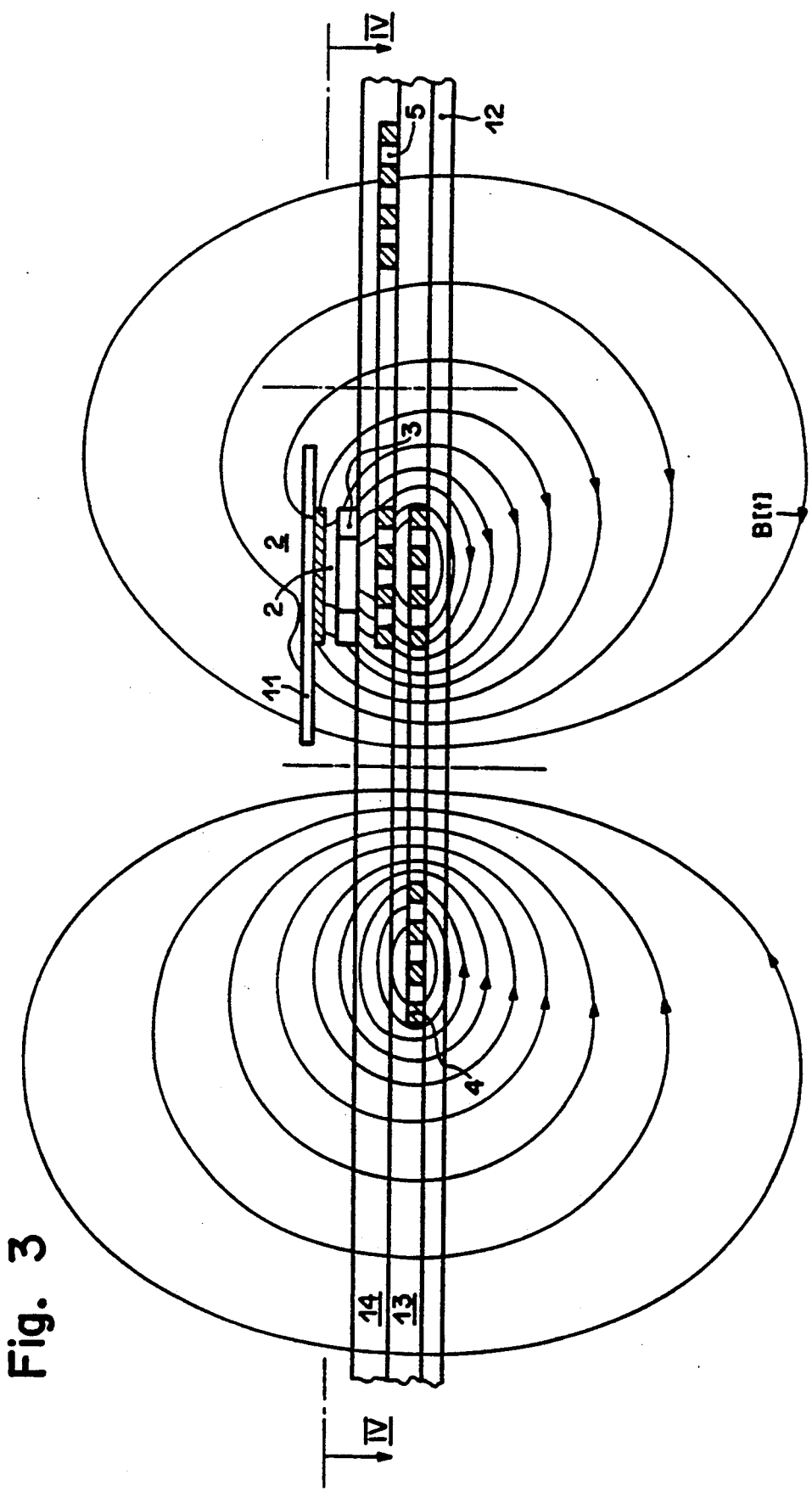
FIG. 3 shows a cross-section of a sensor with a banknote.

In FIG. 3, the magnetic ink is schematically shown as a small black rectangle located below the banknote 11. The sensor is preferably a planar flat sensor having the structure shown in FIGS. 3 and 4. In such a case, the two coils 4 and 5 are preferably single-layer coils which are insulated from each other by a first insulation layer 13. Preferably, the two coils 4 and 5 are also installed in two separate and parallel layers on a support material, e.g., on a substrate 12. Illustratively, the substrate 12 may be made of ceramic or some other inexpensive insulating material.

The two single-layer coils 4 and 5 are preferably in the form of rectangular coils. Each is preferably disposed within its layer so that one fourth of the two single-layer coils 4 and 5, i.e., one rectangular side of straight and parallel conductors of each coil 4 and 5, at least partially overlap each other.

Figure 4:
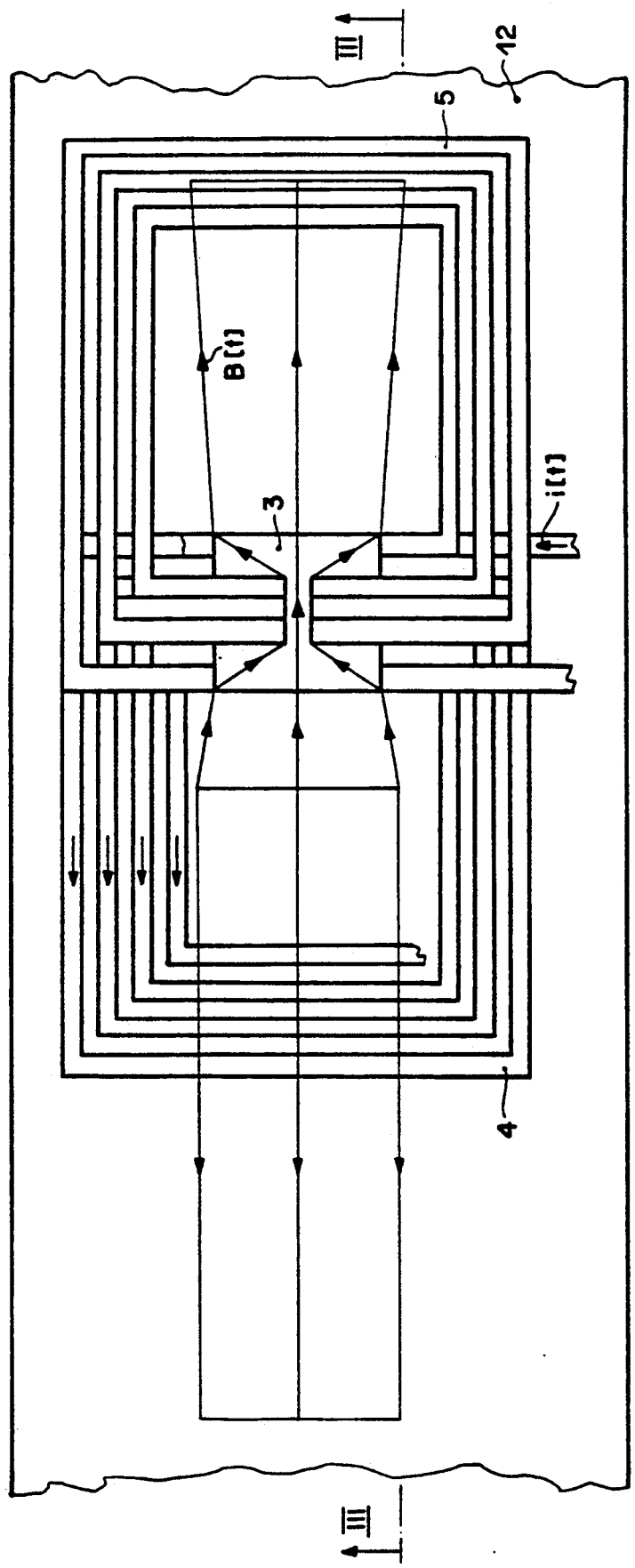
FIG. 4 shows a top view of the sensor shown in FIG. 3, without a banknote.

The ferromagnetic core 3 is thin and has a nearly constant thickness. It is installed in a third layer which is parallel to an electrically insulating second insulation layer 14 formed on the layer which comprises the single-layer coil 5. The core at least partially overlaps the overlapping portion of the two coils 4 and 5. In FIGS. 3 and 4, the coil 4 is installed in a first layer on the substrate 12 while the measuring coil 5 is in turn installed in a second layer on the first insulation layer 13. The core 3 is installed in a third layer on the second insulation layer 14. The air gap 2 of the magnetic circuit 2,3 is defined by the space located outside the upper and lower parallel surfaces of the ferromagnetic core 3.

Figure 5:
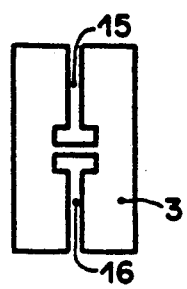
FIG. 5 shows a top view of an alternative core embodiment.

In a first variation of the core 3, shown in FIG. 4, the ferromagnetic core 3 has an H-shaped cross-section taken in parallel with the substrate 12. In a second variation of the core 3, shown in FIG. 5, the ferromagnetic core 3 has a rectangular figure eight cross-section, with its upper and lower cross-strips having an additional air gap 15 or 16. When a banknote is fed past the air gaps 15 and 16, each functions as a reading gap for reading the contents of information of one track of magnetic material present on the banknote. The air gap 2, on the other hand, serves to detect the presence of the magnetic material on the banknote.

The H-shaped or figure-eight-shaped configuration of the core 3 serve to concentrate the magnetic flux. It is desirable to concentrate the magnetic flux as much as possible in the center of the core 3. To that end, the central transversal strip of the core 3 (of either core variation) is preferably kept as narrow as possible. This reduces the demagnetization factor N. For example, the width of the central transversal strip can measure 0.5 mm, and its length 4 mm. For the same reason, the core thickness t is preferably reduced as much as possible.

This can be achieved with especially satisfactory results if the sensor is produced using planar micro-technology. The core 3 preferably has a minimum core thickness t of approximately 0.025 mm when produced using hybrid technology, and approximately 0.5 μm using planar micro-technology. The material of the ferromagnetic core 3 is preferably an amorphous magnetic metal which is also known as "magnet glass". Illustratively, the width of the wide main strips of the H-shaped core 3 is 5 mm, while their length is 40 to 60 mm so as to cover a large portion of the width of a banknote. Thus, although only a single measuring head is used, almost the entire width (at the least, $\frac{1}{4}$ to $\frac{1}{3}$ of the width) of the banknote is scanned.

The demagnetization factor N of a planar sensor is substantially determined by the ratio t/L, i.e., the comparison of the core thickness t with the core length L of the central transversal strip of the H-shaped or figure-eight-shaped core 3. The changes of the demagnetization factor brought about by a banknote bearing magnetic ink can thus occur either as a result of a change in the core length L or in the core thickness t. By using an extremely thin core 3, however, the demagnetization factor N, and therefore also the sensor 1, are much more sensitive to changes in the core thickness t than to changes in the core length L, the former being caused by feeding the banknote 11 near the core 3. For this structure, the coil 4 may not be wound around the core 3 as would be the case if the demagnetization factor were to function in response to a change in the length of core 3. The single-layer coil 4 shown in FIGS. 3 and 4 meets this condition. Thus, in the preferred embodiment, the thickness t, rather than the length L, of the ferromagnetic core 3 is changed by the magnetic substance.

Because the sensor 1 is made as a flat sensor, it requires very little space. Its operation is practically offset-free, i.e., its offset voltage is practically equal to zero. Also, there is practically no signal noise as only the known, extremely weak Barkhausen signal noise of core 3 is present. The output voltage u[t] of sensor 1 is independent of a relative speed between the magnetic substance and the sensor. Static measurement is thus possible.

When the core 3 in the form of a figure eight is used, not only is it possible to detect a magnetic substance but it is also possible to read the configuration of the magnetic substance as the two outer transversal strips of the core 3 are able to read two lines of the banknote. In this manner, the value of the banknote can be determined with a high degree of reliability.

In summary, a magnetic field sensor is disclosed capable of detecting the presence and/or measuring the strength of small quantities of magnetic substances. The embodiments disclosed are intended to be merely illustrative of the invention. Numerous other embodiments may be devised by those ordinarily skilled in the art without departing from the spirit and scope of the following claims.

I claim:

1. A device for detecting the presence of a magnetic substance comprising:

a sensor which operates according to the core saturation principle and which comprises a magnetic circuit which is saturated by a magnetic field having an amplitude $H_s$, said magnetic circuit having a ferromagnetic core and an air gap;

an excitation coil, magnetically coupled to said magnetic circuit for periodically driving said ferromagnetic core into saturation with an excitation magnetic field H[t] having an amplitude $H_{max}$ greater than said saturation magnetic field $H_s$, an even numbered multiple of the amplitude $2k \cdot H_{max}$ being equal to an integral multiple of said saturation magnetic field $nH_s$; and a measuring coil, magnetically coupled to said magnetic circuit, for measuring an effective appearing permeability of the magnetic circuit to detect a change in said effective appearing permeability when the magnetic substance is located in said air gap of said magnetic circuit; and evaluation means for evaluating an $n^{th}$ harmonic, where $2kH_{max}=nH_s$, of a voltage induced in said measurement coil by said excitation magnetic field H[t].

2. The device of claim 1 wherein said harmonic is an even-numbered harmonic.

3. A device for detecting the presence of a magnetic substance comprising:

a sensor which operated according to the core saturation principle and which comprises a magnetic circuit having a ferromagnetic core and an air gap;

an excitation coil, magnetically coupled to said magnetic circuit for periodically driving said ferromagnetic core into saturation; and a measuring coil, magnetically coupled to said magnetic circuit, for measuring an effective appearing permeability of the magnetic circuit to detect a change in said effective appearing permeability when the magnetic substance is located in said air gap of said magnetic circuit; and evaluation means for evaluating a harmonic of a voltage induced in said measurement coil by an excitation magnetic field H[t] whose amplitude $H_{max}$ is larger than a saturation magnetic field ($H_s$) of the magnetic circuit, an even number multiple of the amplitude ($2kH_{max}$) being equal to an integral multiple of the saturation magnetic field ($n \cdot H_s$) where n is the number of the harmonic, wherein said harmonic is an even numbered harmonic.

said sensor further comprising means for generating a constant magnetic field ($H_o$), said constant magnetic field ($H_o$) having a magnitude equal to an odd-numbered integral multiple of the amplitude of said excitation magnetic field $(2k+1)H_{max}$ divided by the mode number, n, for maximizing the amplitude of said even-numbered harmonic.

4. The device of claim 3 wherein a d.c. current flows through said excitation coil for production of said constant magnetic field.

5. The device of claim 3 wherein said even-numbered harmonic is the fourth harmonic of said voltage induced in said measurement coil.

6. The device of claim 5 wherein the amplitude ($H_{max}$) of said excitation magnetic field H[t] is twice the amplitude of said magnetic saturation field ($H_s$) of said magnetic circuit.

7. The device of claim 5 wherein the magnitude of said constant magnetic field ($H_o$) is one fourth the amplitude of said excitation magnetic field.

8. The device of claim 1 wherein said harmonic is an odd-numbered harmonic.

9. The device of claim 8 wherein said magnetic circuit is free of a constant magnetic field.

10. The device of claim 9 wherein said odd-numbered harmonic is the third harmonic of said voltage induced in said measurement coil.

11. The device of claim 10 wherein the amplitude of said magnetic excitation field is 1.5 times the amplitude of said magnetic saturation field of said magnetic circuit.

12. The device of claim 1 wherein said sensor has a flat geometry.

13. The device of claim 12 wherein the thickness of said core is modifiable by said magnetic substance.

14. The device of claim 12 wherein said excitation coil and said measuring coil are single layer coils which are electrically insulated from each other and are located in separate, parallel layers on a support material.

15. The device of claim 14 wherein said measuring coil and said excitation coil are rectangular spirals, said coils being disposed in their respective layers such that one fourth of each coil, comprising straight and parallel conductors, at least partially overlap.

16. The device of claim 15 wherein said ferromagnetic core is thin, has a nearly constant thickness, is electrically insulated and is disposed in a third layer which is parallel to said parallel layers of said coils, said ferromagnetic core at least partially overlapping the overlapping portion of said coils;
wherein said air gap comprises the space outside the upper and lower parallel surface of the ferromagnetic core.

17. The device of claim 16 wherein said ferromagnetic core is H-shaped.

18. The device of claim 16 wherein said ferromagnetic core is rectangular figure eight shaped, the upper and lower transversal strips of which have air gaps.

* * * * *